United States Patent
Hung et al.

(10) Patent No.: US 9,577,672 B2
(45) Date of Patent: Feb. 21, 2017

(54) LOW DENSITY PARITY-CHECK CODE DECODER AND DECODING METHOD THEREOF

(71) Applicant: STORART TECHNOLOGY CO. LTD., Hsinchu (TW)

(72) Inventors: Jui-Hui Hung, Tainan (TW); Chih-Nan Yen, Hsinchu (TW)

(73) Assignee: STORART TECHNOLOGY CO., LTD., Hsinchu (TW)

( * ) Notice: Subject to any disclaimer, the term of this patent is extended or adjusted under 35 U.S.C. 154(b) by 136 days.

(21) Appl. No.: 14/335,327

(22) Filed: Jul. 18, 2014

(65) Prior Publication Data

US 2016/0020785 A1   Jan. 21, 2016

(51) Int. Cl.
  *H03M 13/00*  (2006.01)
  *H03M 13/11*  (2006.01)
  *H03M 13/25*  (2006.01)
  *H04L 1/00*  (2006.01)
  *G11B 20/18*  (2006.01)

(52) U.S. Cl.
  CPC ........... *H03M 13/11* (2013.01); *H03M 13/116* (2013.01); *H03M 13/1137* (2013.01); *H03M 13/255* (2013.01); *H03M 13/6566* (2013.01); *G11B 20/1833* (2013.01); *H04L 1/0026* (2013.01); *H04L 1/0041* (2013.01); *H04L 1/0057* (2013.01)

(58) Field of Classification Search
  CPC ... H03M 13/11; H03M 13/1116; H03M 13/27; H03M 13/35; H03M 13/255; H04L 1/0057; H04L 1/0041; H04L 1/0009; H04L 1/0026; G11B 20/1833
  USPC .................................................. 714/752, 774
  See application file for complete search history.

(56) References Cited

U.S. PATENT DOCUMENTS

| | | | |
|---|---|---|---|
| 7,480,845 B2 * | 1/2009 | Kim ...................... | H03M 13/116 714/752 |
| 7,958,424 B2 * | 6/2011 | Kons .................... | H03M 13/114 714/752 |

(Continued)

*Primary Examiner* — Albert Decady
*Assistant Examiner* — Osman M Alshack
(74) *Attorney, Agent, or Firm* — Li & Cai Intellectual Property (USA) Office

(57) ABSTRACT

The present disclosure illustrates a low density parity-check code decoder adapted for decoding coding data having bit nodes and check nodes. The decoder includes a calculation module and a memory. The calculation module includes k calculation units and n shift units, and the memory includes n memory units. The memory is coupled to the calculation module. Each shift unit is one-to-many coupled to the k calculation units. The n memory units are coupled to the n shift units. The calculation module operatively divides the coding data into n first-bit-strings. The $i^{th}$ calculation unit operatively generates a second-bit-string by calculating $i^{th}$ bits of the n first-bit-strings. The $j^{th}$ shift unit operatively generates a third-bit-string upon receiving $j^{th}$ bits of the k second-bit-strings, and shifts the third-bit-string. The memory units are configured for storing the n shifted third-bit-strings respectively.

6 Claims, 4 Drawing Sheets

(56) References Cited

U.S. PATENT DOCUMENTS

| | | | | |
|---|---|---|---|---|
| 8,443,257 B1* | 5/2013 | Zeng | H03M 13/116 | 714/758 |
| 2006/0220928 A1* | 10/2006 | Ito | H03M 5/145 | 341/50 |
| 2009/0063926 A1* | 3/2009 | Cho | H03M 13/1102 | 714/752 |
| 2009/0199073 A1* | 8/2009 | Kanaoka | G11B 20/1833 | 714/758 |
| 2009/0276682 A1* | 11/2009 | Lakkis | H03M 13/1117 | 714/752 |
| 2010/0146365 A1* | 6/2010 | Yano | H03M 13/255 | 714/752 |
| 2010/0153813 A1* | 6/2010 | Myung | H03M 13/1185 | 714/752 |
| 2010/0153819 A1* | 6/2010 | Ueng | H03M 13/1137 | 714/763 |
| 2010/0325511 A1* | 12/2010 | Oh | H03M 13/116 | 714/752 |
| 2011/0283158 A1* | 11/2011 | Yang | H03M 13/114 | 714/752 |
| 2012/0117337 A1* | 5/2012 | Shibayama | H03M 7/24 | 711/154 |
| 2012/0159282 A1* | 6/2012 | Ito | H03M 13/2966 | 714/758 |
| 2012/0185750 A1* | 7/2012 | Hayami | H03M 13/1111 | 714/758 |

* cited by examiner

LOW DENSITY PARITY-CHECK CODE DECODER AND DECODING METHOD THEREOF

BACKGROUND

1. Technical Field

The present disclosure relates to a decoder, in particular, to a low density parity-check code decoder and a decoding method thereof.

2. Description of Related Art

During data transmission, data may be lost or damaged due to the poor reliability of the transmission medium or external interferences. Error correcting code or error control code has been designed for correcting the damaged or lost data and the reconstruction of the raw data. Common error correcting codes include Hamming Code, Reed Solomon Code, Bose Chaudhuri Hocquengham (BCH) Code, and Low Density Parity Check (LDPC) Code. Low density parity-check code has better capability of error detecting and error correcting than others, and it can decode at a high-speed rate. In the parallel-structure design of the traditional low density parity-check code decoder, in order to increase the computing parallelism and avoid the writing/reading problem in the row blocks and column blocks of the memory, the decoder usually divides the memory into memory blocks by the cyclic matrix unit, and operates writing or reading the memory blocks at the same time. But in this way, when the storage is written or read in the calculation processing, the data collision will still occur.

Thus, although the low density parity-check code includes a plurality of advantages, there exist many problems such as the data collision, circuit area, and calculating complexity that need improvement.

SUMMARY

An exemplary embodiment of the present disclosure provides a low density parity-check code decoder adapted for decoding coding data having bit nodes and check nodes. The decoder includes a calculation module and a memory. The calculation module includes k calculation units and n shift units, and the memory includes n memory units. The memory is coupled to the calculation module. Each shift unit is one-to-many coupled to the k calculation units. The n memory units are coupled to the n shift units. The calculation module operatively divides the coding data into n first-bit-strings. The $i^{th}$ calculation unit operatively generates a second-bit-string by calculating $i^{th}$ bits of the n first-bit-strings. The $j^{th}$ shift unit operatively generates a third-bit-string upon receiving $j^{th}$ bits of the k second-bit-strings, and shifts the third-bit-string. The memory units are configured for storing the n shifted third-bit-strings, wherein $k \geq 1$, $n \geq 1$, $k \geq i > 0$, $n \geq j > 0$, and i, j, k, n are integers.

An exemplary embodiment of the present disclosure provides a low density parity-check code decoding method comprising the following steps. Firstly, the coding data is divided into n first-bit-strings. Then, $i^{th}$ bits of n first-bit-strings are calculated by a $i^{th}$ calculation unit of k calculation units, and the calculation units generate k second-bit-strings. Then, a third-bit-string is generated upon a $j^{th}$ shift unit of n shift units receiving $j^{th}$ bits of k second-bit-strings, and the shift units shift the third-bit-strings. Finally, the shifted third-bit-strings are stored into n shift units respectively, wherein $k \geq 1$, $n \geq 1$, $k \geq i > 0$, $n \geq j > 0$, and i, j, k, n are integers.

To sum up, the low density parity-check code decoder and decoding method provided according to the exemplary embodiment of the present disclosure can avoid data collision occurring in the writing or reading as in the traditional low density parity-check code decoder. In other words, in the decoder provided according to the present disclosure, the parallel-structure design increases the computing parallelism of the low density parity-check code decoder by dividing the memory into memory blocks by the cyclic matrix unit, and the low density parity-check code decoder further utilizes only one switching network to replace the many switching networks needed in writing and reading when the traditional decoder calculates, so as to reduce the number of bit node units utilized in the traditional decoder. Thus, the low density parity-check code decoder and the decoding method provided according to the exemplary embodiment of the present disclosure can avoid data collision and reduce the computing time. Generally, the present disclosure improves the problem of the traditional low density parity-check code decoder having the high decoding capability but high cost, and reduces the cost of the decoder.

In order to further understand the techniques, means and effects of the present disclosure, the following detailed descriptions and appended drawings are hereby referred to, such that, and through which, the purposes, features and aspects of the present disclosure can be thoroughly and concretely appreciated, however, the appended drawings are merely provided for reference and illustration, without any intention that they be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
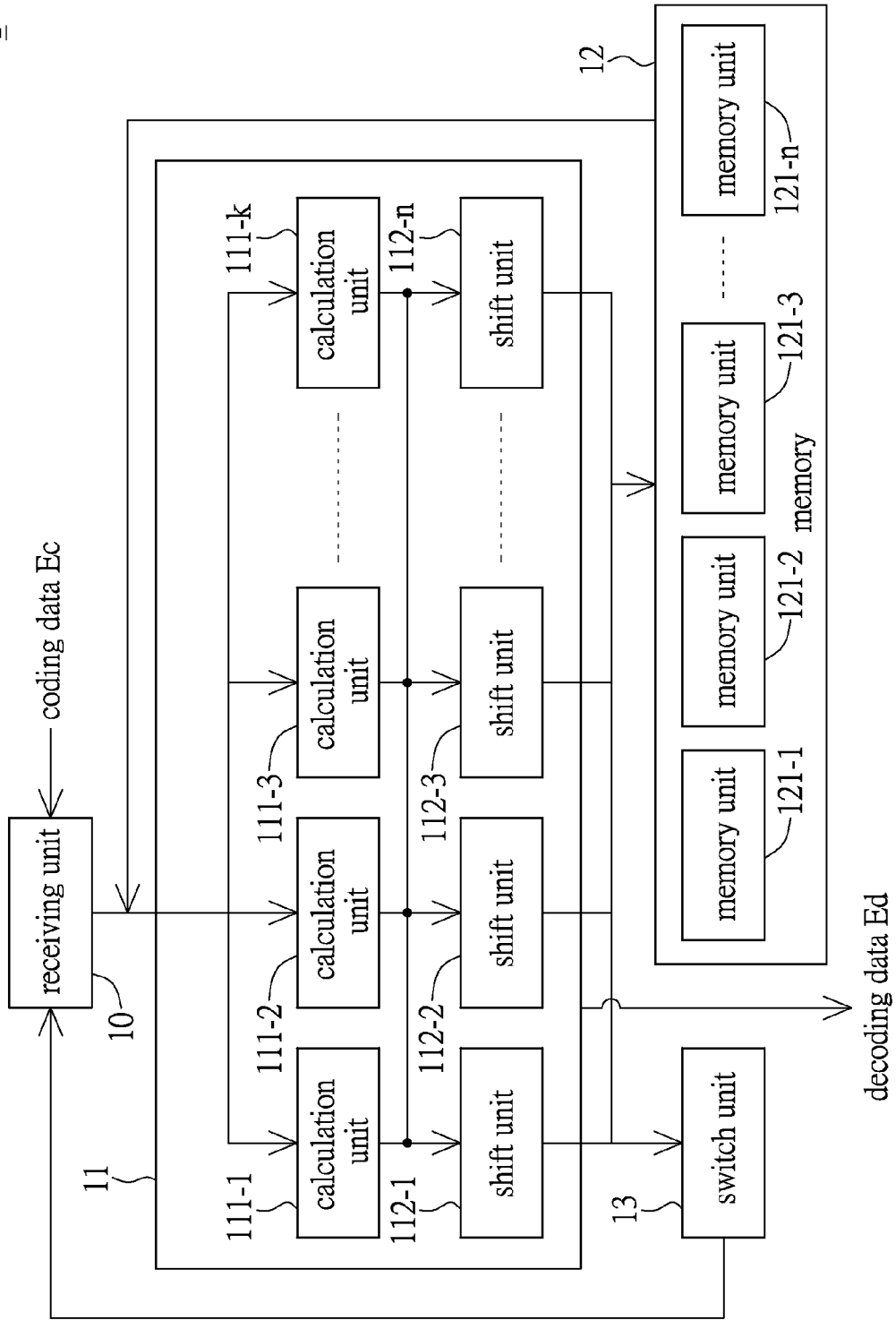
FIG. 1 is a block diagram of a low density parity-check code decoder of an embodiment according to the present disclosure.

Reference will now be made in detail to the exemplary embodiments of the present disclosure, examples of which are illustrated in the accompanying drawings. However, they may be embodied in different forms and should not be construed as limited to the embodiments set forth herein. In the drawings, the thickness and relative thickness of layers and regions may be exaggerated for clarity. Wherever possible, the same reference numbers are used in the drawings and the description to refer to the same or like parts.

It will be understood that, although the terms 'first', 'second', 'third', etc., may be used herein to describe various elements, these elements should not be limited by these terms. The terms are used only for the purpose of distinguishing one component from another component.

Thus, a first element discussed below could be termed a second element without departing from the teachings of the embodiments. As used herein, the term "or" includes any and all combinations of one or more of the associated listed items.

Please refer to FIG. 1. FIG. 1 is a block diagram of a low density parity-check code decoder of an embodiment according to the present disclosure. As FIG. 1 shows, the present disclosure is a decoder 1 utilizing the low density parity-check code, configured for decoding coding data Ec having bit nodes and check nodes to generate decoding data Ec and confirm the correctness thereof. The coding data Ec is coded from original data (not illustrated) by a coder. The knowledge of the bit nodes and the check nodes in the error correcting code is known by those persons skilled in the art, it is omitted thereto. It is worth noting, the low density parity-check code utilized by the decoder 1 is Quasi Cyclic Low Density Parity-Check (QC-LDPC) in the present disclosure.

The decoder 1 includes a receiving unit 10, a calculation module 11, a memory 12, and a switch unit 13. The calculation module 11 includes calculation units 111-1, 111-2, . . . , 111-k and shift units 112-1, 112-2, . . . , 112-n. The memory 12 includes memory units 121-1, 121-2, . . . , 121-n. The calculation module 11 is coupled to the receiving unit 10, and the memory 12 is coupled to the calculation module 11. The memory 12 and the switch unit 13 are coupled to the calculation module 11.

The receiving unit 10 is configured for receiving the coding data Ec and temporary storing therein. Then, the receiving unit 10 initializes the bit nodes of the coding data Ec, to provide the decoder 1 decoding. In the embodiment of the present disclosure, the receiving unit 10 initializes the bit nodes of the coding data Ec by log likelihood ratio (LLR), to satisfy the algorithm model in the calculation module 11 utilizing the low density parity-check code. However, the receiving unit 10 also can be implemented by another way (e.g., normalization) to initialize the bit nodes of the coding data Ec, and is not limited thereto. Additionally, in the embodiment of the present disclosure, the receiving unit 10 is a register, or a high-speed storage component having limited storage capacity, configured for temporarily storing commands, data and addresses. In the decoder 1, the register belongs to the top level of the memory levels, also the fast way operating on the data of the system. The register is usually estimated by the capacity thereof, such as 8-bits register or 32-bits register. In the embodiment of the present disclosure, the register is usually implemented by a register array, but can also be used independently by a flip flop, a high-speed kernel memory, a thin film memory, or etc., and is not limited thereto.

The calculation module 11 is configured for calculating the coding data Ec received from the receiving unit 10. More specifically, the calculation module 11 decodes the coding data Ec having the bit nodes and the check nodes. The calculation module 11 divides the coding data Ec into n first-bit-strings upon receiving coding data Ec, wherein the length of each first-bit-string is k bits.

The calculation units 111-1, 111-2, . . . , 111-k are configured for operatively and respectively calculating the $1^{st}$ bits, $2^{nd}$ bits, . . . , and $k^{th}$ bits of the n first-bit-strings divided by the calculation module 11, and generating k second-bit-strings respectively, wherein k, n≥1, and are integers. All calculation units 111-1, 111-2, . . . , 111-k calculate the all first-bit-strings and generate the k second-bit-strings. In other words, a $i^{th}$ one of the calculation units 111-1, 111-2, . . . , 111-k collects the $i^{th}$ bits from the n first-bit-strings, and the length of the second-bit-string is n, wherein k≥i>0, and i is an integer. For instance, the calculation unit 11 divides the coding data Ec into 15 first-bit-strings, and each first-bit-string is 16-bits. The calculation unit 111-1 receives each $1^{st}$ bit of each first-bit-string and calculates thereon, meaning the calculation unit 111-1 receives and calculates a bit-string with the length of 15. Identically, the calculation unit 111-2 receives each $2^{nd}$ bit of each first-bit-string and calculates thereon, meaning the calculation unit 111-2 receives and calculates another bit-string with the length of 15, and so on. In the embodiment of the present disclosure, the calculation units 111-1, 111-2, . . . , 111-k can be a central process unit (CPU), a micro control unit (MCU), or other components having computing capability, but is not limited thereto.

The shift units 112-1, 112-2, . . . , 112-n are configured for shifting the bit-strings. Each shift unit 112-1, 112-2, . . . , 112-n is one-to-many coupled to every calculation unit 111-1, 111-2, . . . , 111-k. The shift unit 112-1, 112-2, . . . , 112-n operatively and respectively generate third-bit-strings upon receiving $1^{st}$, $2^{nd}$, . . . , and $n^{th}$ bits of the k second-bit-strings, and shift the third-bit-strings. The length of the first-bit-string and the length of the third-bit-string are equal to k. In the embodiment of the present disclosure, bits shifted by the shift units 112-1, 112-2, . . . , 112-n are predetermined according to the user, but is not limited thereto.

The memory 12 is configured for storing the data needed in processing. In detail, since the decoder 1 calculates the low density parity-check code by the iteration algorithm, each calculation result is stored in the memory 12. In the embodiment of the present disclosure, the memory 12 can be implemented by a flash memory chip, a read only memory (ROM), a random access memory (RAM), or other a volatility memory and a non-volatility memory, but is not limited thereto. Furthermore, decoder 1 divides the cyclic matrix into a plurality of memory blocks, which means the memory 12 includes a plurality of memory units 121-1, 121-2, . . . , 121-n. The memory units 121-1, 121-2, . . . , 121-n are coupled to the shift units 112-1, 112-2, . . . , 112-n, and configured for storing the shifted third-bit-stings processed from the shift units 112-1, 112-2, . . . , 112-n. The length of a bit capacity of each memory unit 121-1, 121-2, . . . , 121-n is equal to or longer than a code length of the coding data, and the bit capacity comprises a plurality of word string storages, wherein the length of the capacity in the word-string storage is equal to or greater than the number (k) of the calculation units 111-1, 111-2, . . . , 111-k. It is worth noting that when the length of the capacity in the word-string storage is equal to the number (k) of the calculation units 111-1, 111-2, . . . , 111-k, the decoder 1 can achieve the optimal cost. Additionally, the memory 12 also includes the non-utilized memory unit (not illustrated). More specifically, the memory 12 includes m memory (m≥n≥1). The embodiment of the present disclosure illustrates using the memory units 121-1, 121-2, . . . , 121-n to provide storing in calculating, and other (m−n) memory units are not utilized. In another embodiment, can also choose n memory units from m memory units instantly, and (m−n) memory units are utilized for the next calculation process. In other words, (m−n) memory units are not instantly utilized, but this is not limited thereto.

The switch unit 13 is configured for operatively switching message passing to a calculating mode or a receiving mode. The switch unit 13 switches to a calculating mode when receiving the coding data Ec from the receiving unit 10. The calculation module 11 performs the iteration algorithm calculation to the cyclic low density parity-check code, and stops the algorithm calculation according to a predetermined value or a syndrome text. In other words, the calculation module 11 checks whether a count of calculation equals to a predetermined value or a syndrome text. When the calculation is stopped, the switch unit 13 switches to the receiving mode, to provide the next coding data Ec for calculating by the calculation module 11.

Figure 2:
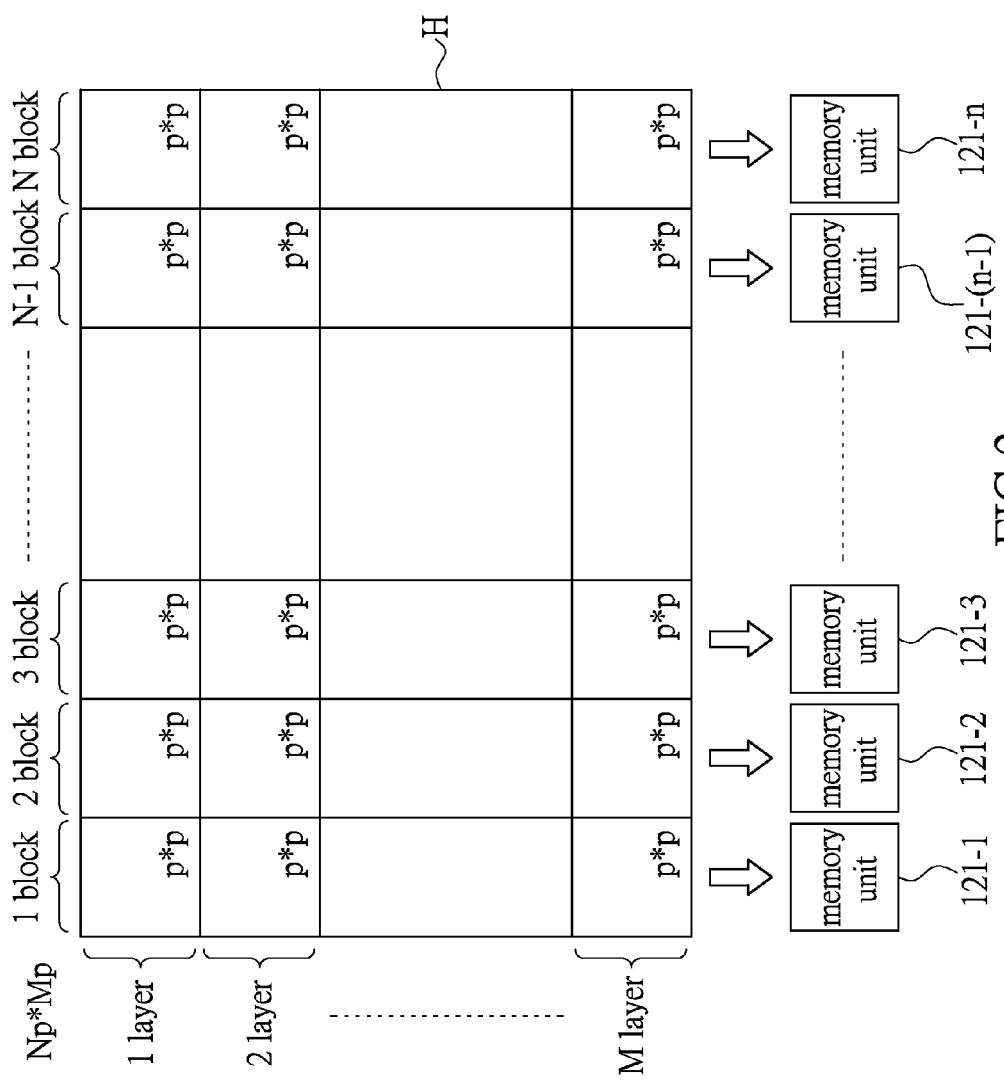
FIG. 2 is a diagram of partitions of the cyclic parity-check matrix of an embodiment according to the present disclosure.

Please refer to FIG. 2. FIG. 2 is a diagram of partitions of the cyclic parity-check matrix of an embodiment according to the present disclosure. The decoder provided by the embodiment of the present disclosure is based on the structure of the cyclic parity-check matrix H, wherein the cyclic parity-check matrix H is a matrix Np*Mp and takes the block p*p as the unit. Each block p*p has the characteristic of the cyclic shift as the unit matrix, but every cyclic shift of the block is different from each other. The blocks of the each row are stored by the memory units 121-1, 121-2, . . . , 121-n respectively. For instance, users can utilize a matrix 1024*512 of the cyclic parity-check matrix H, wherein each block is a matrix 32*32. The detail about the characteristic of the cyclic parity-check matrix is known by those skilled in the art to error correction code, and so is omitted thereto.

Figure 3:
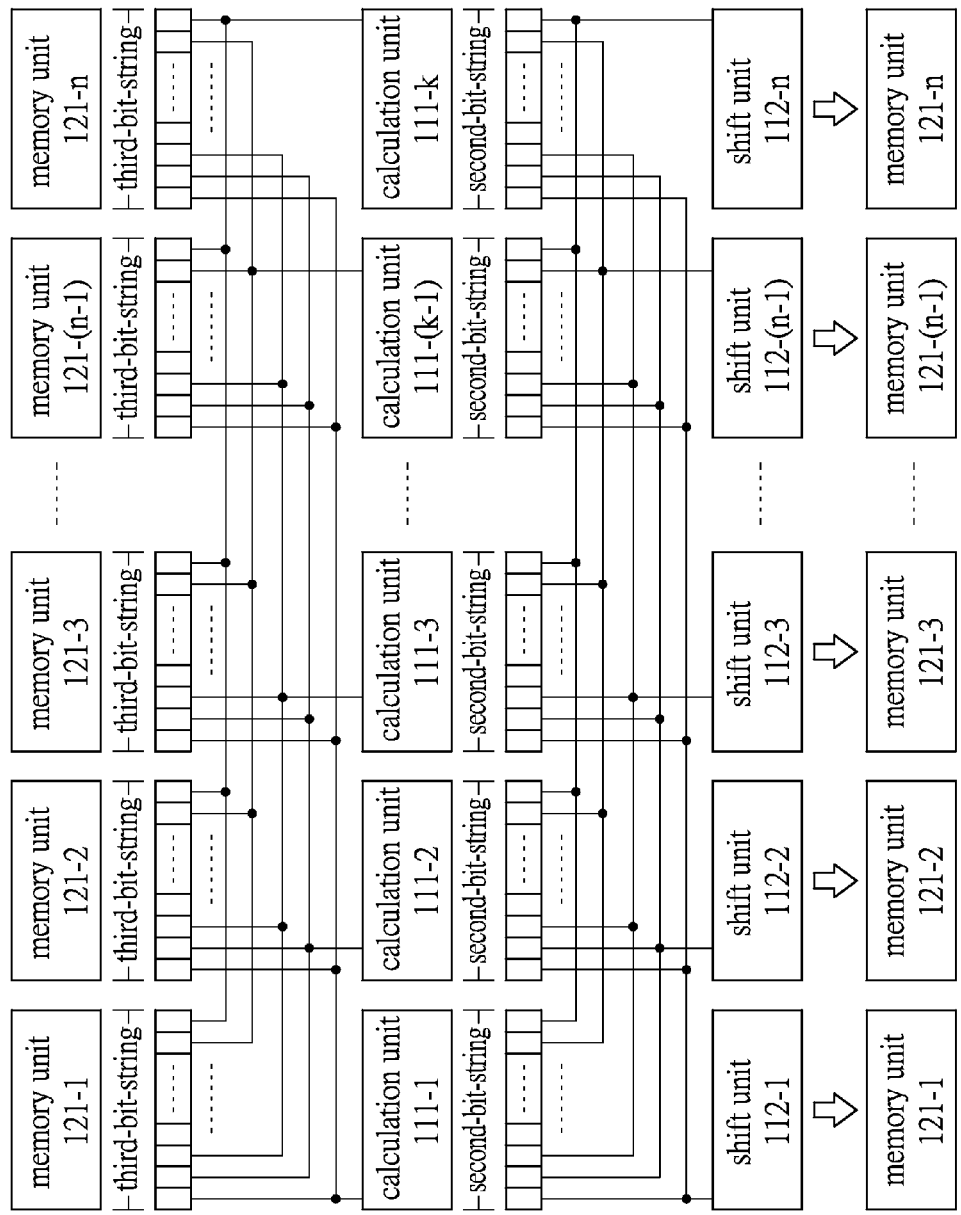
FIG. 3 is a diagram of a calculation procedure of the low density parity-check code decoder of an embodiment according to the present disclosure.

Please refer to FIG. 3 in conjunction with FIG. 1. FIG. 3 is a diagram of a calculation procedure of the low density parity-check code decoder of the embodiment according to the present disclosure. In the processing of the decoder provided by the embodiment of the present disclosure, the calculation module 11 performs the calculation by the iteration algorithm and stores the calculation result of the block of each cyclic parity-check matrix H to the memory units 121-1, 121-2, . . . , 121-n. Then, there repeats the calculation of iteration algorithm said above.

More specifically, in the processing of repeated calculation, the calculation module 11 reads the third-bit-strings stored generated from the memory units 121-1, 121-2, . . . , 121-n in a previous calculation. Then, the calculation units 111-1, 111-2, . . . , 111-k are configured for operatively reading the $1^{st}$, $2^{nd}$, . . . , and $k^{th}$ bits of the n third-bit-strings respectively, and generating k new second-bit-strings respectively, wherein the length of the new second-bit-string is n. Each shift unit 112-j generates a new third-bit-string upon receiving the $j^{th}$ bits of the k second-bit-strings, and shifts the new third-bit-string. Finally, the n new third-bit-strings are stored in the original memory units 121-1, 121-2, . . . , 121-n respectively, to provide the next calculation till the calculation module 11 achieves the count of calculation equal to the predetermined value or the syndrome text equals to zero, and outputs the decoding data Ed.

Figure 4:
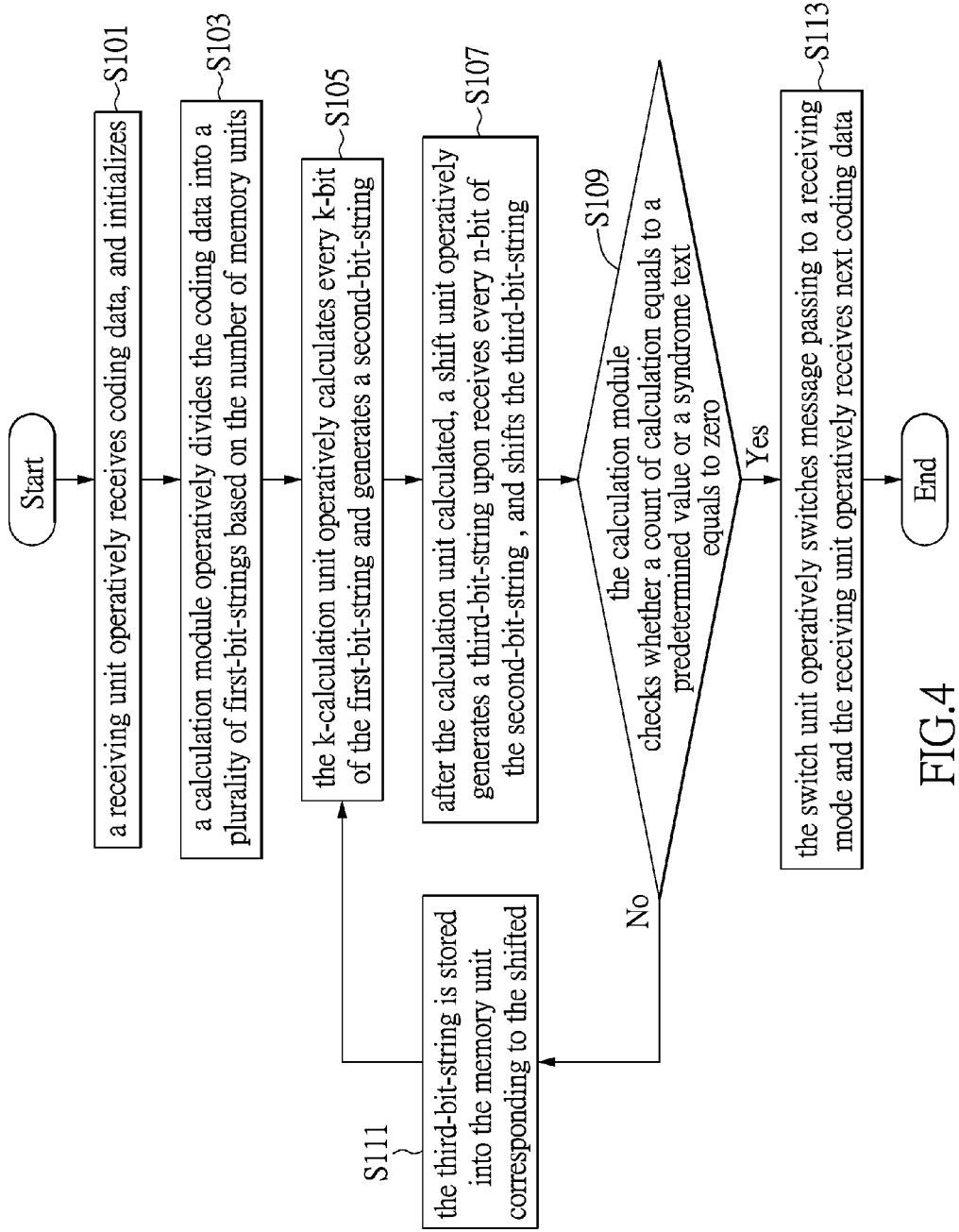
FIG. 4 is a flow chart of the low density parity-check code decoder of an embodiment according to the present disclosure.

Please refer to FIG. 4. FIG. 4 is a flow chat of the low density parity-check code decoder of the embodiment according to the present disclosure. The decoding method of the embodiment of the present disclosure comprises the following steps. In step S101, a receiving unit operatively receives coding data, and initializes. In step S103, a calculation module operatively divides the coding data into a plurality of first-bit-strings based on the number of memory units. In step S105, the $i^{th}$ calculation unit of the k calculation units operatively calculates $i^{th}$ bits of the n first-bit-strings and generates a second-bit-string, wherein k≥i>0, and i is an integer. In step S107, after the calculation units are calculated, a $j^{th}$ of the n shift units operatively generates a third-bit-string upon receiving $j^{th}$ bits of the k second-bit-strings, and shifts the third-bit-string, wherein n≥j>0, and j is an integer. In step S109, the calculation module checks whether a count of calculation equals to a predetermined value or a syndrome text equals to zero. In step S111, the third-bit-string is stored into the memory unit corresponding to the shifted unit. In the S113, the switch unit operatively switches message passing to a receiving mode and the receiving unit operatively receives the next coding data.

Please refer to FIG. 4 in conjunction with FIG. 1 and FIG. 3. In the step S101, the receiving unit 10 operatively receives the coding data Ec and initializes the bit nodes of the coding data Ec to provide to the decoder 1 to decode. In the step S103, the coding data Ec is divided into n first-bit-strings when the calculation module 11 receives the coding data Ec, wherein the length of the first-bit-string is k bits.

In the step S105, the calculation units 111-1, 111-2, . . . , 111-k are configured for calculating the respectively $1^{st}$, $2^{nd}$, . . . , and $k^{th}$ bits of the n first-bit-strings divided by the calculation module 11, and respectively generating the k second-bit-strings. For instance, the calculation module 11 divides into 15 first-bit-strings, and each first-bit-string has 16 bits. The calculation unit 111-1 receives the $1^{st}$ bits of the n first-bit-strings and calculates a second-bit-string with the length of 15. Identically, the calculation unit 111-2 receives $2^{nd}$ bits of the n first-bit-strings and calculates thereon, meaning the calculation unit 111-2 is receiving and calculating another bit-string with the length of 15, and so on. It is worth to note that operations of all calculation units are performed in the same time.

In step S107, after the calculation units 111-1, 111-2, . . . , 111-k are calculated, the shift unit 112-j operatively generates a third-bit-string upon receiving $j^{th}$-bits of the k second-bit-strings, and shifts the third-bit-string. It is worth to note that the bit shifted by each shift unit is predetermined according to the user.

In the step S109, the calculation module 11 checks whether a count of calculation equals to a predetermined value or a syndrome text equals to zero. If the judgment is YES, the calculation module 11 outputs the decoding data Ed and goes to the step S113. If the judgment is NO, the calculation module 11 goes to the step S111.

In the step S111, the third-bit-string is stored into the memory unit 121-j corresponding to the shifted unit 112-j, to provide the third-bit-string for calculating next. It is worth noting, the length of a bit capacity of the memory unit 121-j is equal to or longer than a code length of the coding data, and the bit capacity comprises a plurality of word string storages, wherein the length of the capacity in the word-string storage is equal to or greater than the number (number k) of the calculation units.

In the step S113, after the calculation module 11 has outputted the decoding data Ed, so long as the calculation module 11 achieves the condition of stopping calculating, the switch unit 13 operatively switches message passing to a receiving mode and the receiving unit 10 operatively receives the next coding data Ec for the calculation module 11 to decode.

To sum up, the low density parity-check code decoder and decoding method provided according to the exemplary embodiment of the present disclosure can avoid data collision occurring in the writing or reading by the traditional low density parity-check code decoder. In other words, in the decoder provided according to the present disclosure, the parallel-structure design increases the computing parallelism of the low density parity-check code decoder by the memory being divided into memory blocks by the cyclic matrix unit, and the low density parity-check code decoder further utilizes only one switching network to replace many switching networks as needed in writing and reading when the decoder calculates, so as to reduce the number of bit node units utilized in the traditional decoder. Thus, the low density parity-check code decoder and decoding method provided according to the exemplary embodiment of the present disclosure can avoid the data collision and reduce the computing time. Generally, the present disclosure improves the problem that although the traditional low density parity-check code decoder has high decoding capability it also has high cost, by reducing the cost of the decoder.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A low density parity-check code decoder, adapted for decoding coding data having bit nodes and check nodes, comprising:
    a calculation module, configured for dividing the coding data into n first-bit-strings, comprising:
    k calculation units, wherein a $i^{th}$ calculation unit operatively calculates $i^{th}$ bits of the n first-bit-strings and generates a second-bit-string, wherein k≥i>0, i is an integer, the length of the second-bit-string is equal to n, and the calculation units simultaneously calculate the first-bit-strings and generate the second-bit-strings; and
    n shift units, wherein each shift unit is one-to-many coupled to the k calculation units, and a $j^{th}$ shift unit operatively generates a third-bit-string upon receiving $j^{th}$ bits of the second-bit-strings, and shifts the third-bit-string, wherein n≥j>0, j is an integer, and the length of the first-bit-string and the length of the third-bit-string are equal to k both; and
    a memory, coupled to the calculation module, comprising:
    n memory units, coupled to the n shift units, configured for storing the shifted third-bit-strings respectively;
    wherein k≥1, n≥1, k≥i>0, n≥j>0, and i, j, k, n are integers;
    wherein the length of a bit capacity of each memory unit is equal to or longer than a code length of the coding data, and the bit capacity comprises a plurality of word string storages;
    wherein the length of the capacity in the word-string storage is equal to or greater than the number of the calculation units.

2. The low density parity-check code decoder according to claim 1, further comprising:
    a receiving unit, operatively receiving the coding data and initializing the bit nodes of the coding data.

3. The low density parity-check code decoder according to claim 2, wherein the calculation module decides whether to stop calculating based on a predetermined value or a syndrome text.

4. The low density parity-check code decoder according to claim 1, further comprising:
    a switch unit, coupled to the calculating module, configured for switching message passing to a calculating mode or a receiving mode.

5. The low density parity-check code decoder according to claim 1, wherein the low density parity-check code is a Quasi Cyclic Low Density Parity-Check (QC-LDPC).

6. A low density parity-check code decoding method, adapted for decoding coding data having bit nodes and check nodes, comprising:
    dividing the coding data into n first-bit-strings;
    calculating $i^{th}$ bits of the n first-bit-strings by a $i^{th}$ calculation unit of k calculation units and generating a second-bit-string, wherein k≥i>0, i is an integer, the length of the second-bit-string is equal to n, and the calculation units simultaneously calculate the first-bit-strings and generate the second-bit-strings;
    generating a third-bit-string upon a $j^{th}$ shift unit of n shift units upon receiving $j^{th}$ bits of the second-bit-strings, and shifting the third-bit-strings, wherein n≥j>0, j is an integer, and the length of the first-bit-string and the length of the third-bit-string are equal to k both; and
    storing the n shifted third-bit-strings into n memory units respectively;
    wherein k≥1, n≥1, k≥i>0, n≥j>0, and k, n, i, j are integers;
    wherein the length of a bit capacity of each memory unit is equal to or longer than a code length of the coding data, and the bit capacity comprises a plurality of word string storages;
    wherein the length of the capacity in the word-string storage is equal to or greater than the number of the calculation units.

* * * * *